United States Patent
Taillie

(10) Patent No.: US 6,486,459 B1
(45) Date of Patent: Nov. 26, 2002

(54) COLOR BEAM SPLITTER USING AIR-SPACED PRISMS

(75) Inventor: Joseph P. Taillie, Pittsford, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/385,263

(22) Filed: Aug. 30, 1999

(51) Int. Cl.[7] .............................................. H01L 27/00
(52) U.S. Cl. ..................... 250/208.1; 250/216; 250/234
(58) Field of Search .............................. 250/208.1, 234, 250/216, 226; 358/474, 493, 494; 359/634, 629, 637, 638

(56) References Cited

U.S. PATENT DOCUMENTS

| | | | |
|---|---|---|---|
| 4,709,144 A | * 11/1987 | Vincent ...................... | 250/226 |
| 4,870,268 A | * 9/1989 | Vincent et al. ............. | 250/226 |
| 4,926,041 A | * 5/1990 | Boyd .......................... | 250/226 |
| 5,227,620 A | 7/1993 | Elder, Jr. et al. ........... | 250/208 |
| 5,541,771 A | * 7/1996 | Bohn .......................... | 359/634 |

\* cited by examiner

*Primary Examiner*—Frank G. Font
*Assistant Examiner*—Roy M. Punnoose
(74) *Attorney, Agent, or Firm*—John M. Kelly; Joseph M. Young

(57) ABSTRACT

Color scanners that separate multi-wavelength light into color components having substantially equal optical path lengths. An colorscanner includes a first prism that receives multi-wavelength light, internally reflects a first component and passes second and third components into a first gap. A first reflector reflects the second and third components back into the first prism. The component parts then pass into a second prism that internally reflects the first and second component parts but passes the third component into a second gap. A second reflector reflects the third component part back into the second prism. A third prism then receives the color components, internally reflects the third component part, and passes the first and second component parts into a third gap. A third reflector reflects the first and second component parts back into the third prism. A fourth prism then receives the color components, internally reflects the second and third components, and passes the first component into a fourth gap. A fourth reflector then reflects the first component part back into the fourth prism. The color components then exit from the fourth prism.

20 Claims, 3 Drawing Sheets

COLOR BEAM SPLITTER USING AIR-SPACED PRISMS

FIELD OF THE INVENTION

This invention relates to color scanners. More specifically, this invention relates to color scanners having beam splitters that separate multi-wavelength light into component parts.

BACKGROUND OF THE INVENTION

Optical scanning is a well-known and frequently used technique for converting an image on a substrate into a digital representation comprised of digital values that represent small image cells or "pixels" of the image. A digital representation is useful because it can be conveniently modified, stored, copied, and/or transmitted.

Optical scanning is usually performed by placing an image bearing substrate on a stationary transparent platen, moving a light-emitting scan bar across the platen, and projecting the light reflected from the substrate and its image into a sensor assembly. The sensor assembly beneficially includes an optical sensor array that digitizes the reflected light into a "scan line" comprised of a plurality of pixels. As the scan bar scans the substrate the optical scanner assembly continuously produces digital representations of scan lines. When the scanning is complete the digitized scan lines represent the substrate's image.

While the foregoing broadly describes scanning, scanning a color image is somewhat more complicated because each scan line requires a set of digital representations, one set for each color component. Typically, three color components, red, green and blue, are used. Various techniques are available for obtaining digital representations of the component color images. One approach is to make multiple scanning passes across the substrate using a different filter for each pass. This enables the production of multiple color digital representations using one optical sensor. However, since multiple scans are required this process is relatively slow. Another approach is to use multiple light-emitting scan bars and optical scanner assemblies. While fast, this approach is relatively expensive.

Another color scanning approach is to use one light-emitting scan bar, a wavelength-sensitive beam splitter, and multiple optical arrays. For example, polychromatic light (white light) can illuminate a narrow line of the substrate, the reflected polychromatic light can then be split into red, green and blue beams that are simultaneously projected onto separate light sensor arrays, and the resulting digital representations can then be obtained. This approach has the advantages of high speed at moderate cost.

One wavelength-sensitive beam splitter is a prism. As is well known, white light input to a prism is separated into its color components. Prisms operate because of the wavelength dependency of the refractive index of the prism material (usually glass). Thus by using a plurality of prisms it is possible to separate the reflected light into its various color components. However, a problem with using prisms is that the various light colors have different focal points. Since multiple optical sensor arrays are beneficially produced on a single flat substrate the use of prisms results in defocused color light. Therefore a new beam splitter that separates a multi-wavelength beam light into color components such that the color components have substantially the same optical path lengths would be beneficial.

SUMMARY OF THE INVENTION

The principles of the present invention provide for prism systems that separate a multi-wavelength light beam into a plurality of color components that have substantially the same optical path lengths. An optical system according to the principles of the present invention includes a first prism that receives multi-wavelength light, internally reflects a first component, and passes second and third component parts into a first gap. The second and third components are then reflected by a first reflector back into the first prism. The three component parts then pass into a second prism that internally reflects the first and second component parts buts passes the third component into a second gap. A second reflector then reflects the third component part back into the second prism. A third prism then receives the color components, internally reflects the third component part, and passes the first and second component parts into a third gap. A third reflector then reflects the first and second component parts back into the third prism. A fourth prism then receives the color components, internally reflects the second and third components, and passes the first component into a fourth gap. A fourth reflector then reflects the first component part back into the fourth prism. The color components then exit from the fourth prism. If the gaps are dimensioned properly the color components will have substantially the same optical path lengths.

BRIEF DESCRIPTION OF THE DRAWINGS

Other aspects of the present invention will become apparent as the following description proceeds and upon reference to.

DETAILED DESCRIPTION OF A PREFERRED EMBODIMENT OF THE INVENTION

Figure 1:
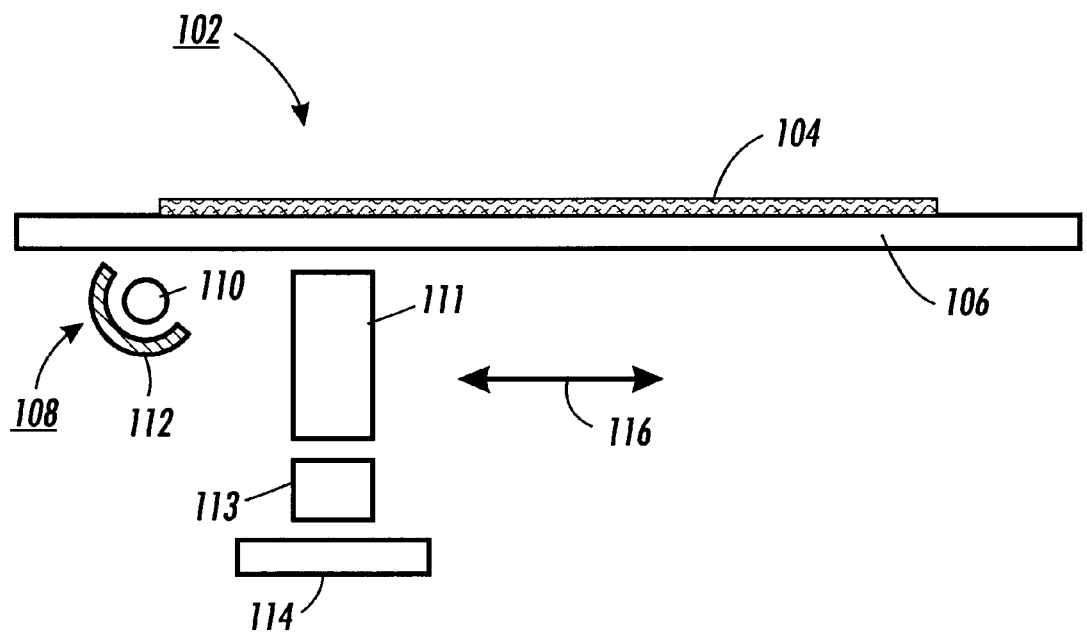
FIG. 1, which schematically illustrates a color scanner that incorporates the principles of the present invention.

Referring now to FIG. 1, the preferred embodiment of the present invention is a color scanner 102. That color scanner scans a document 104 having a color image that rests on a transparent glass platen 106. The document 104 is placed on the platen either manually or by a suitable automatic document handler or feeder (that is not shown). A light assembly 108 comprised of a multi-wavelength light source 110 and a reflector 112, a lens 111, a prism system 113, and a sensor array 114 are mounted for joint reciprocating motion 116 under the platen using a scanning carriage (not shown).

The light assembly 108 illuminates a line-like area of the platen with the multi-wavelength (white) light. The illuminating light passes through the transparent platen, reflects off the image on the document 104, is collected and focused by the lens 111, and passes into the prism system 113. As is explained in more detail subsequently, the prism system separates the white light into three color components, red, blue, and green, and directs those color components onto the sensor array 114.

Figure 2:
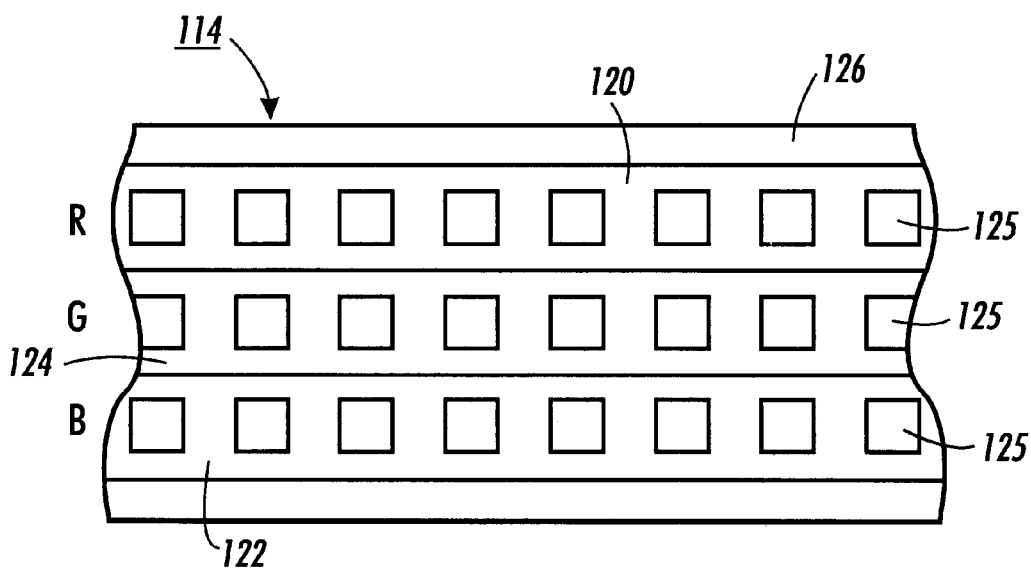
FIG. 2, which illustrates a sensor array used in the color scanner illustrated in FIG. 1.

Referring now to FIG. 2, the sensor array 114 is comprised of three separate color component CCDs (charge coupled devices), a red array CCD 120, a blue CCD array 122, and a green CCD 124 that are all located on a common substrate 126. Each color component CCD is comprised of a plurality of individual photosensitive elements 125 that convert received photons into electrons. Those electrons are subsequently integrated over time and converted into digital signals in ways that are well known to those skilled in the applicable arts.

The principles of the present invention are directed to separating the multi-wavelength light into color components such that the optical path lengths of the color components are equal. When incorporated into the color scanner 102 the principles of the present invention produce individual color components that are separated and focused onto their respective color component CCD.

Figure 3:
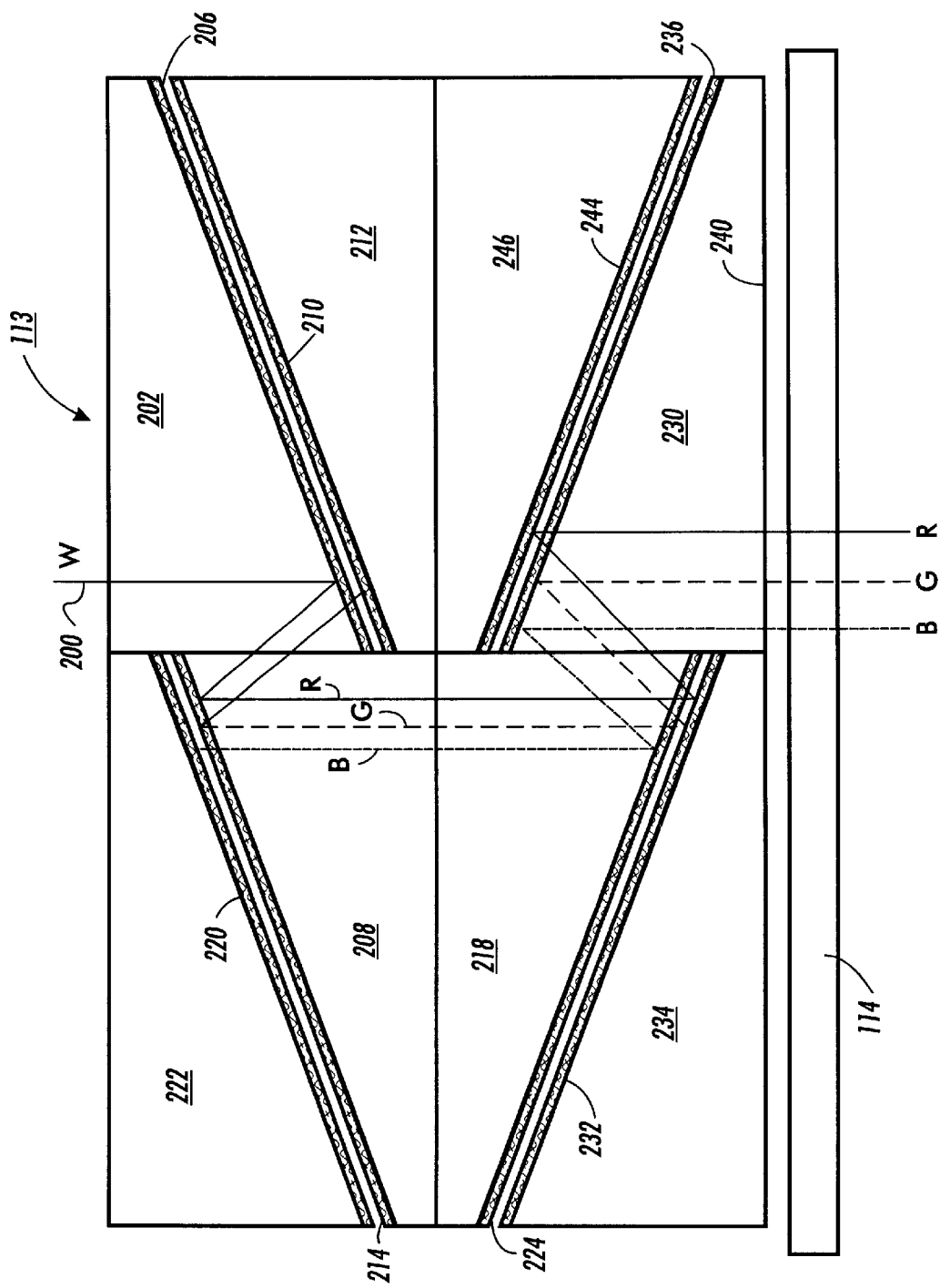
FIG. 3, which schematically illustrates a prism system used in the color scanner illustrated in FIG. 1; and to FIG. 4, which schematically illustrates an alternative prism system for use in the color scanner illustrated in FIG. 1.

FIG. 3 is a simplified schematic diagram of one embodiment of the prism system 113. White light 200 from the lens 111 (see FIG. 1) is directed into a prism 202 having an angled surface coated with a red reflecting filter 206. That filter reflects the red component of the white light back into the prism 202 and then into an abutting prism 208. Meanwhile, the green-blue components of the white light pass through the red reflecting filter 206 and reflect off of a green-blue reflecting filter 210 on a prism 212. The green-blue light reflects back through the red reflecting filter 206, into the prism 202, and then into the abutting prism 208.

The prism 208 includes a red-green reflecting filter 214 that internally reflects the red and green back into the prism 208 and into an abutting prism 218. Meanwhile, the blue component from the prism 202 passes through the red-green reflecting filter 214 and reflects off of a blue reflecting filter 220 on a prism 222. The reflected blue light then passes back through the red-green reflecting filter 214, through the prism 208, and into the abutting prism 218. The white light 200 has now been separated into red, green, and blue components. However, the optical path lengths of the color components are not the same. Therefore, if the color components were taken from the prism 218 they would not all properly focus on the sensor array 114.

To properly focus the color components, and to increase the color component separation, the red, green, and blue components continue passing through the prism system. The prism 218 includes a blue reflecting filter 224 on an angled edge that reflects the blue component back through the prism 218 and into an abutting prism 230. Meanwhile, the red and green color components from the prism 218 pass through the blue reflecting filter 224 and reflect off of a red-green reflecting filter 232 on a prism 234. The reflected red and green components then pass back through the blue reflecting filter 224, through the prism 218 and into the abutting prism 230.

The prism 230 includes a blue-green reflecting filter 236 on an angled surface. The blue and green components reflect off of the blue-green reflecting filter 236, pass back through the prism 230, and exit from a surface 240. Meanwhile, the red component passes through the blue-green reflecting filter 236 and reflects off of a red reflecting filter 244 on a prism 246. The reflected red light then passes back through the blue-green reflecting filter 236, through the prism 230, and out the surface 240. The white light 200 has now been separated into red, green, and blue components that have similar optical path lengths and that focus in the same plane.

Still referring to FIG. 3, the separated red, green, and blue components are then imaged onto the sensor array 114 such that the color components illuminate their respective CCD array.

Figure 4:
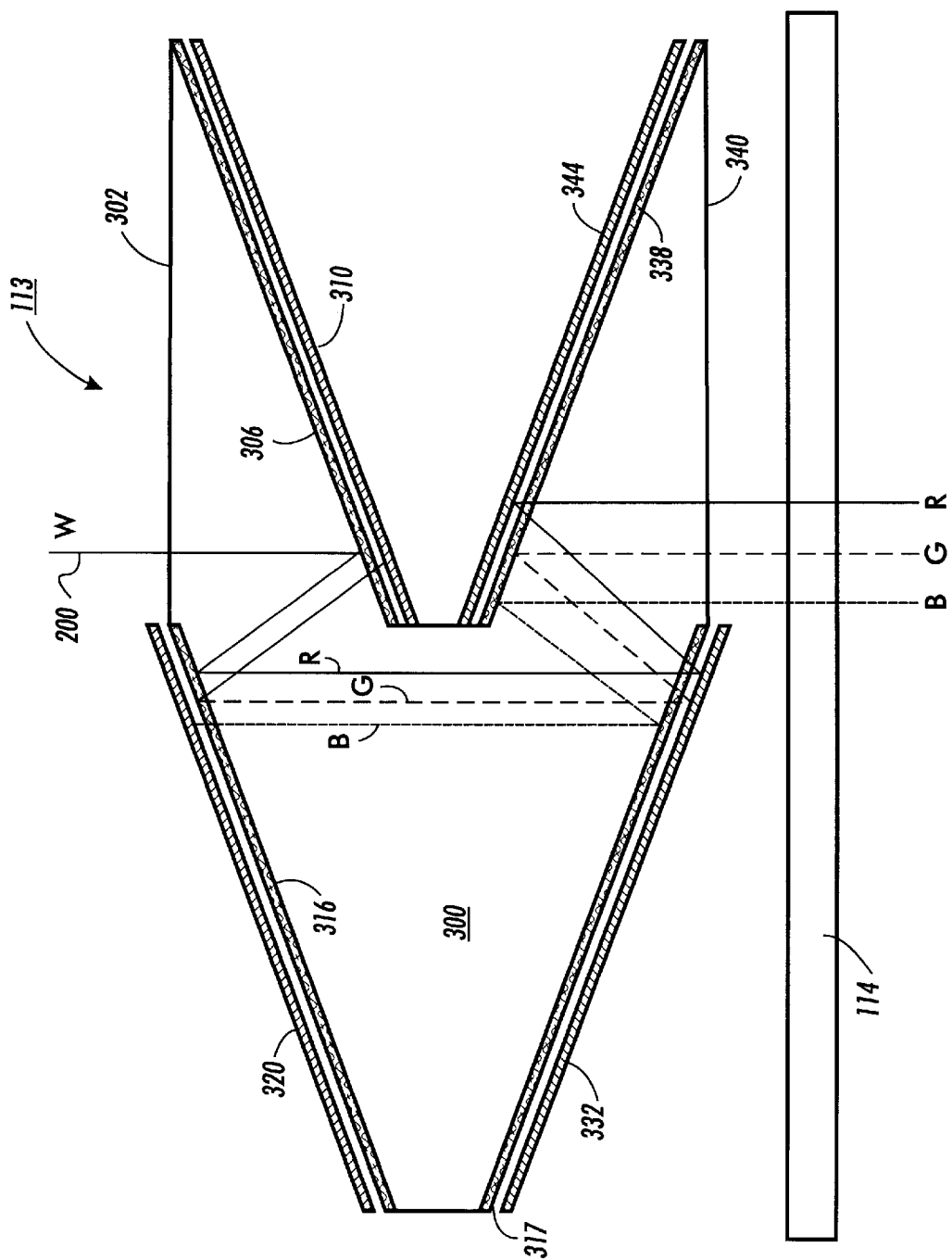

While the prism assembly illustrated in FIG. 3 is beneficial in that it is comprised of 8 identical, discrete prisms, often simple pieces of glass or transparent plastic, with different reflective coatings, the principles of the present invention are useful with many different embodiments. For example, FIG. 4 illustrates an alternative prism system 113 that uses a single piece of glass 300 to form the internally reflecting prisms and metallic mirrors that reflect the external color components back into the glass. White light 200 is directed into a first surface 302 of the glass 300. That light passes through a prism section of the glass and onto an angled surface that is coated with a red reflecting filter 306. That filter reflects the red component of the white light back into the glass and toward a red-green reflecting filter 316. Meanwhile, the green-blue components of the white light pass through the filter 306 and reflect off of a metallic mirror 310. The green-blue light then reflects back through the red reflecting filter 306, into the glass 300, and toward the red-green reflecting filter 316.

The red-green reflecting filter 316 reflects the red and green components back into the glass and toward a blue reflecting filter 317. Meanwhile, the blue component passes through the red-green reflecting filter 316, reflects off of a metallic mirror 320, passes back through the red-green reflecting filter 316, and toward the blue reflecting filter 317.

The blue reflecting filter 317 reflects the blue component back through the glass and to a blue-green reflecting filter 338. Meanwhile, the red and green color components pass through the blue reflecting filter 317, reflect off of a metallic mirror 332, pass back into the glass, and to the blue-green reflecting filter 338.

The blue-green reflecting filter internally reflects the blue and green components to a surface 340 from which they exit. Meanwhile, the red component passes through the blue-green reflecting filter 338, reflects off of a metallic mirror 344, passes back into the glass, and out the exit 340. The white light 200 has now been separated into red, green, and blue components that have the same optical path lengths and that focus in the same plane. Those color components are then imaged onto the sensor array 114 such that the color components illuminate their respective CCD array.

It should be understood that the foregoing figures are not to scale. For example the various filters and reflectors can be thin layers, the air gap spaces can be very small and the color component separations are likely to be very small. Additionally, the color filter and reflector combinations are examples only, other filter combination will also work. Therefore, the present invention is to be limited only by the appended claims.

What is claimed:

1. An optical system for separating multi-wavelength light into first, second, and third component parts, comprising:

a first prism for receiving said multi-wavelength light, for internally reflecting said first component part, and for passing said second and third component parts into a first gap;

a first reflector for reflecting said second and third component parts in said first gap back into said first prism;

a second prism for receiving said first, second, and third component parts from said first prism, for internally reflecting said first and second component parts, and for passing said third component part into a second gap;

a second reflector for reflecting said third component part in said second gap back into said second prism;

a third prism for receiving said first, second, and third component parts from said second prism, for internally reflecting said third component part, and for passing said first and second component parts into a third gap;

a third reflector for reflecting said first and second component parts in said third gap back into said third prism;

a fourth prism for receiving said first, second, and third component parts from said third prism, for internally reflecting said second and third component parts, and for passing said first component part into a fourth gap; and a fourth reflector for reflecting said first component part in said fourth gap back into said fourth prism;

wherein said first, second, and third component parts pass from said fourth prism.

2. An optical system according to claim 1, wherein an external surface of said first prism is coated with an optically selective thin film.

3. An optical system according to claim 2, wherein said optically selective thin film is in contact with said first gap.

4. An optical system according to claim 1, wherein said first reflector is on a fifth prism.

5. An optical system according to claim 1, wherein said first reflector is an optically selective thin film in contact with said first gap.

6. An optical system according to claim 1, wherein said first reflector is a metallic mirror.

7. An optical system according to claim 1, wherein said first gap is a transparent medium.

8. An optical system according to claim 1, wherein said first, second, and third components have substantially equal optical path lengths.

9. An optical system according to claim 1, wherein a plurality of said first, second, third and fourth prisms are physically part of a single element.

10. An optical scanner, comprising:

a platen for holding a substrate having an image;

a light source emitting multi-wavelength light;

a scanning mechanism for scanning said platen with said multi-wavelength light so as to produce multi-wavelength light that is reflected from said substrate;

an optical system for receiving said. reflected multi-wavelength light and for separating said reflected multi-wavelength light into first, second, and third component parts; and a sensor assembly comprised of first, second, and third light sensitive arrays on a substrate, said sensor assembly for receiving said first, second, and third component parts respectively on said first, second, and third light sensitive arrays, said sensor assembly further for producing a digital representation of said image from outputs of said first, second, and third light sensitive arrays;

wherein said optical system is comprised of:

a first prism for receiving said reflected multi-wavelength light, for internally reflecting said first component part, and for passing said second and third component parts into a first gap;

a first reflector for reflecting said second and third component parts in said first gap back into said first prism;

a second prism for receiving said first, second, and third component parts from said first prism, for internally reflecting said first and second component parts, and for passing said third component part into a second gap;

a second reflector for reflecting said third component part in said second gap back into said second prism;

a third prism for receiving said first, second, and third component parts from said second prism, for internally reflecting said third component part, and for passing said first and second component parts into a third gap;

a third reflector for reflecting said first and second component parts in said third gap back into said third prism;

a fourth prism for receiving said first, second, and third component parts from said third prism, for internally reflecting said second and third component parts, and for passing said first component part into a fourth gap; and a fourth reflector for reflecting said first component part in said fourth gap back into said fourth prism; and wherein said first, second, and third component parts pass from said fourth prism.

11. An optical scanner according to claim 10, wherein an external surface of said first prism is coated with an optically selective thin film.

12. An optical scanner according to claim 11, wherein said optically selective thin film is in contact with said first gap.

13. An optical scanner according to claim 10, wherein said first reflector is on a fifth prism.

14. An optical scanner according to claim 10, wherein said first reflector is an optically selective thin film in contact with said first gap.

15. An optical system according to claim 10, wherein said first reflector is a metallic mirror.

16. An optical scanner according to claim 10, wherein a plurality of said first, second, third and fourth prisms are physically part of a single element.

17. An optical scanner according to claim 10, wherein said first gap is an air gap.

18. An optical scanner according to claim 10, wherein said first, second, and third components have substantially equal optical path lengths.

19. The optical system of claim 1, wherein the first prism, the second prism, the third prism, and the fourth prism are approximately identical to each other.

20. The optical system of claim 19, wherein each of the first prism, the second prism, the third prism, and the fourth prism have a trapezoidal cross-section having at least one right angle.

* * * * *